(12) United States Patent  (10) Patent No.: US 7,400,134 B2
Morishita et al.  (45) Date of Patent: Jul. 15, 2008

(54) INTEGRATED CIRCUIT DEVICE WITH MULTIPLE CHIPS IN ONE PACKAGE

(75) Inventors: Yoshiaki Morishita, Kanagawa (JP); Nobuteru Oh, Kanagawa (JP); Tomoaki Isozaki, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 11/036,980

(22) Filed: Jan. 19, 2005

(65) Prior Publication Data

US 2005/0156616 A1 Jul. 21, 2005

(30) Foreign Application Priority Data

Jan. 20, 2004 (JP) ............... 2004-011676

(51) Int. Cl.
*H01L 23/48* (2006.01)
*H01L 29/10* (2006.01)
(52) U.S. Cl. .............. 324/158.1; 324/763; 258/48; 258/777; 258/686
(58) Field of Classification Search ............ None
See application file for complete search history.

(56) References Cited

U.S. PATENT DOCUMENTS

| | | | | |
|---|---|---|---|---|
| 5,734,199 A * | 3/1998 | Kawakita et al. | ............ | 257/737 |
| 6,369,407 B1 * | 4/2002 | Hikita et al. | ............ | 257/48 |
| 6,392,292 B1 * | 5/2002 | Morishita | ............ | 257/686 |
| 6,392,304 B1 | 5/2002 | Butler | | |
| 6,448,636 B2 * | 9/2002 | Suenaga et al. | ............ | 257/678 |
| 6,456,101 B2 | 9/2002 | Dumbri | | |
| 6,538,264 B2 * | 3/2003 | Corbett et al. | ............ | 257/48 |
| 6,548,907 B1 * | 4/2003 | Yamada et al. | ............ | 257/773 |
| 6,620,633 B2 * | 9/2003 | Hembree et al. | ............ | 438/14 |
| 6,630,685 B1 * | 10/2003 | Lunde | ............ | 257/48 |
| 6,683,374 B2 * | 1/2004 | Goller et al. | ............ | 257/686 |
| 6,756,803 B2 * | 6/2004 | Miura et al. | ............ | 324/763 |
| 6,815,712 B1 * | 11/2004 | Kline | ............ | 257/48 |
| 6,831,294 B1 * | 12/2004 | Nishimura et al. | ............ | 257/48 |
| 6,833,626 B2 * | 12/2004 | Kajiwara et al. | ............ | 257/777 |
| 6,858,941 B2 * | 2/2005 | Ference et al. | ............ | 257/781 |
| 6,881,593 B2 * | 4/2005 | Le et al. | ............ | 438/14 |
| 6,914,259 B2 * | 7/2005 | Sakiyama et al. | ............ | 257/48 |
| 6,940,093 B2 * | 9/2005 | Eldridge et al. | ............ | 257/48 |
| 7,019,407 B2 * | 3/2006 | Chen et al. | ............ | 257/778 |
| 7,104,804 B2 * | 9/2006 | Batinovich | ............ | 439/71 |
| 2003/0151047 A1 * | 8/2003 | Corbett et al. | ............ | 257/48 |
| 2005/0030055 A1 * | 2/2005 | Tran et al. | ............ | 324/763 |
| 2007/0290363 A1 * | 12/2007 | Kyung | ............ | 257/777 |

FOREIGN PATENT DOCUMENTS

| | | |
|---|---|---|
| JP | 04-336442 A | 11/1992 |
| JP | 06-302768 A | 10/1994 |
| JP | 2000-227457 A | 8/2000 |
| JP | 2003-068972 A | 3/2003 |

\* cited by examiner

*Primary Examiner*—Paresh Patel
(74) *Attorney, Agent, or Firm*—Sughrue Mion, PLLC (57) ABSTRACT

The integrated circuit device includes a memory chip and a logic chip. The memory chip has memory I/O pads and test pads. The test pads are placed in line at the position outer than memory I/O pads and larger than the memory I/O pads. The logic chip has logic COC I/O pads. The logic COC I/O pads are connected to the memory I/O pads.

15 Claims, 10 Drawing Sheets

RELATED ART

*Fig. 15*

INTEGRATED CIRCUIT DEVICE WITH MULTIPLE CHIPS IN ONE PACKAGE

FIELD OF THE INVENTION

The present invention relates to an integrated circuit device which combines multiple chips in one package.

DESCRIPTION OF RELATED ART

Integrated circuit devices include several functions such as CPU, logic circuit, memory and so on, each function in a separate chip or multiple functions in one chip. Technology of System in Package (SiP) which integrates multiple functions into one systematized package is advancing rapidly.

The SiP involves a Chip-on-Chip (COC) structure, which includes a plurality of semiconductor chips in such a way that a semiconductor chip stacked on top of another semiconductor chip. For example, in the Chip-on-Chip SiP, two semiconductor chips are connected by face-down bonding, with their circuit surfaces facing each other. In the explanation below, the circuit surface refers to the surface on which an integrated circuit is formed.

Figure 15:
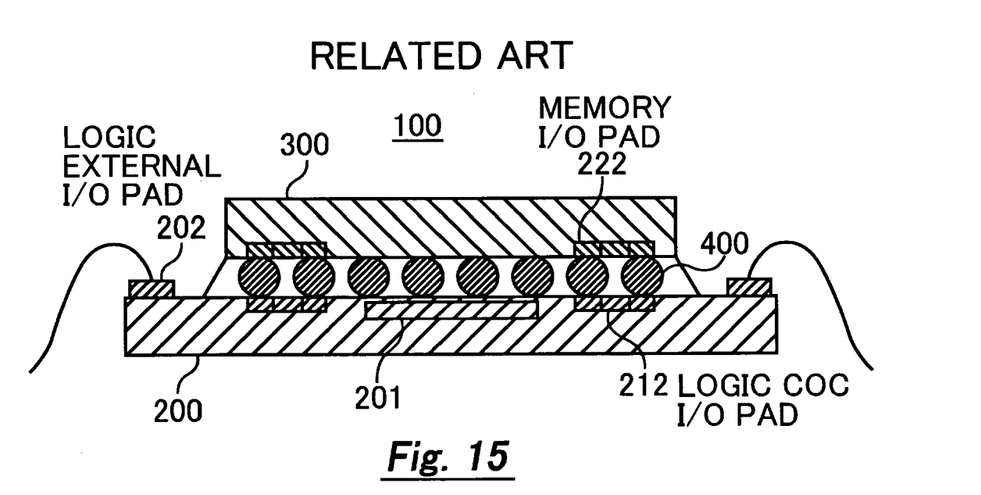
FIG. 15 is a schematic longitudinal cross-sectional view of a conventional integrated circuit device.

Referring first to FIG. 15, the structure of a conventional integrated circuit device having the Chip-on-Chip SiP structure is explained. In this integrated circuit device, the lower semiconductor chip has a Built-In Self-Test (BIST) circuit which tests the upper semiconductor chip. This structure is described in U.S. Pat. No. 6,456,101 to Dumbri, for example.

FIG. 15 is a schematic cross-sectional view of the conventional integrated circuit device. In this integrated circuit device, a memory chip 300 is mounted on top of a logic chip 200 having a memory BIST circuit 201. A memory I/O pad 222 of the memory chip 300 and a logic COC I/O pad 212 of the logic chip 200 are electrically connected by a gold bump 400. The memory BIST circuit 201 is an internal circuit placed near the circuit surface of the logic chip 200 to test the memory chip 300.

This integrated circuit device places the memory BIST circuit 201, which tests the memory chip 300, in the logic chip 200. Thus, after completing SiP, it is possible to test the memory chip 300 with the memory BIST circuit 201 via the logic COC I/O pad 212 and the memory I/O pad 222.

To meet the increasing demand for higher-speed and more sophisticated integrated circuits, higher integration and higher density integrated circuits are rapidly developed, resulting in an increase in the number of I/O pads and a decrease in the pitch between the pads. However, the present invention has recognized that conventional integrated circuit devices, such as shown in FIG. 15, are not prepared for such situations and thus fail to conduct sufficient testing, which can cause a decrease in test coverage and yield.

Testing of the Chip-on-Chip SiP generally involves a unit test and a system test in order to increase yield. The unit test tests a semiconductor chip alone before forming SiP to remove defective chips. The system test tests the SiP after combining the semiconductor chips to form SiP. Further, the SiP system test involves a test which checks the operation of the whole SiP and a test which checks the operation of each of the semiconductor chips of the SiP in order to clarify the defective portion. In the unit test of the semiconductor chip and the system test of the SiP, probes of a tester are brought into contact with the I/O pads.

For example, when testing the memory chip 300 alone before forming the SiP, the probing to the memory I/O pads 222 is performed. If the pitch of the memory I/O pads 222 is smaller than the pitch of the probes of a normal tester, a normal tester fails the simultaneous probing to adjacent pads. Further, if the number of the memory I/O pads 222 is larger than the number of probes of a normal tester, a normal tester fails the simultaneous probing to all the pads. This causes untested pattern to exist, reducing the test coverage. Furthermore, since a normal tester allows the limited number of pads to be probed at the same time, some pads which are not probed are floating. This unstabilizes input and output logics or current consumption, which can inhibit accurate testing.

When testing the memory chip 300 after completing the SiP, the memory BIST circuit 201 of the logic chip 200 tests the memory chip 300 via the memory I/O pads 222. If a large number of the memory I/O pads 222 are placed with a very small pitch, wiring capacity can affect input and output signals. Due to the wiring capacity, it may be unable to conduct the test with a high-speed clock like the unit test of the memory chip 300 before forming SiP, which can further reduce the test coverage.

SUMMARY OF THE INVENTION

According to one aspect of the present invention, there is provided an integrated circuit device which includes a first semiconductor chip having a plurality of first input/output pads in an array and a plurality of test pads placed in line at a position outer than the plurality of first input/output pads and being larger than the first input/output pads; and a second semiconductor chip having a plurality of second input/output pads connected to the plurality of first input/output pads. The integrated circuit device enables probing and testing with a normal tester in testing of a semiconductor chip before packaging. This allows increase in test coverage and yield.

According to another aspect of the present invention, there is provided an integrated circuit device which includes a memory chip having a plurality of first input/output pads and a plurality of probe test pads larger than the plurality of first input/output pads; and a non-memory chip placed below the memory chip and having a plurality of second input/output pads connected to the plurality of first input/output pads by a bump. The integrated circuit device enables probing and testing with a normal tester in testing of a semiconductor chip before packaging. This allows increase in test coverage and yield.

The present invention provides an integrated circuit with high test coverage and high yield.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

An integrated circuit device of a first embodiment of the invention is explained hereinafter with reference to FIGS. 1 to 8. The integrated circuit device has test pads in addition to I/O pads of a semiconductor chip. The test pad is used for probing in tests.

Figure 1A:
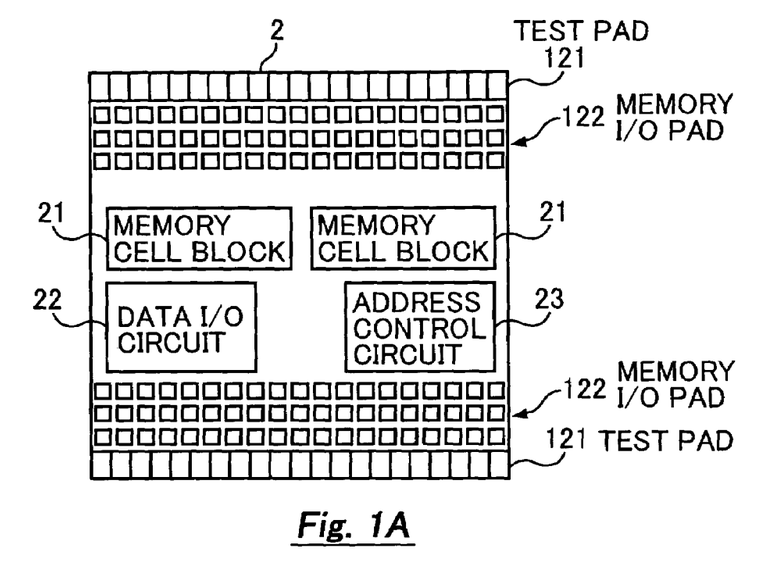
FIGS. 1A and 1B are schematic plan views of semiconductor chips constituting an integrated circuit device according to the invention.
Figure 1B:
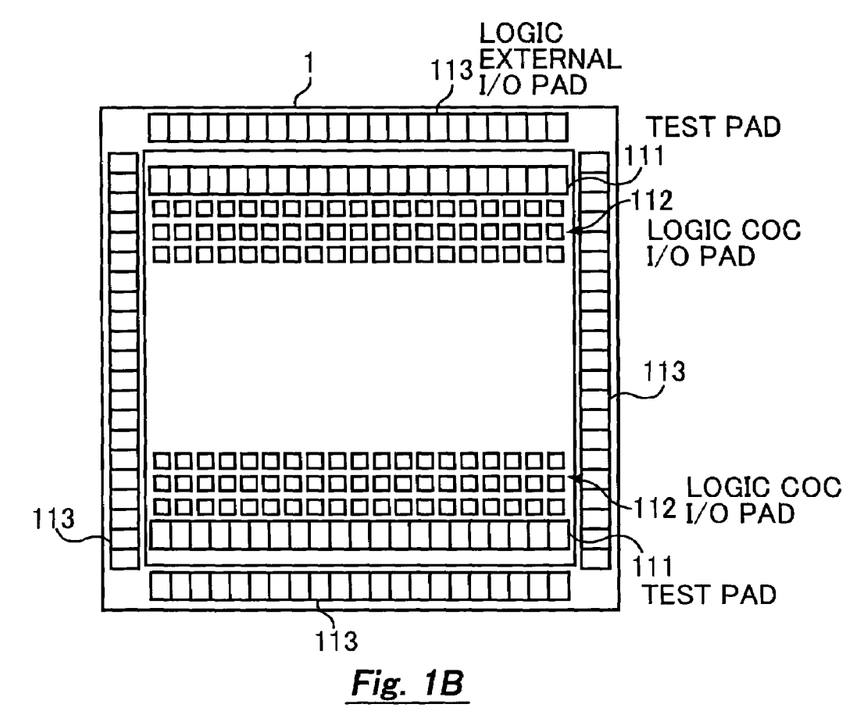

FIGS. 1A and 1B are schematic plan views of a memory chip 2 and a logic chip 1, respectively, which constitute an integrated circuit device 10 of this embodiment. As detailed in FIG. 8, the logic chip 1 and the memory chip 2 are semiconductor chips which constitute the integrated circuit device 10 configured using the Chip-on-Chip SiP technology. The memory chip 2 (first semiconductor chip) is mounted on top of the logic chip 1 (second semiconductor chip). The memory chip 2 is, for example, a chip having a memory element, which may be a dynamic random-access memory (DRAM) and so on. The logic chip 1 is, for example, a non-memory chip for writing or reading data to or from the memory chip 2, which may be an application specific integrated circuit (ASIC) and so on. The logic chip 1 and the memory chip 2 are not limited to these examples, and they may be semiconductor chips having other functions.

As shown in FIG. 1A, the memory chip 2 includes a memory cell block 21, a data I/O circuit 22, an address control circuit 23, memory I/O pads 122 (first I/O pads), and test pads 121.

The memory cell block 21, the data I/O circuit 22, and the address control circuit 23 are internal circuits located in substantially central part of the circuit surface of the memory chip 2. The memory cell block 21 is, for example, a memory cell array which includes a plurality of memory cells to store data. The address control circuit 23 is, for example, a decoder which decodes data write address or read address and selects a given memory cell of the memory cell block 21. The data I/O circuit 22 is, for example, a buffer circuit which amplifies and writes data into or amplifies the data read from the memory cell of the memory cell block 21 selected by the address control circuit 23.

The test pads 121 are placed in the peripheral part of the circuit surface of the memory chip 2 at the position outer than the memory I/O pads 122. The test pads 121 are used for probing in the testing of the memory chip 2 before forming SiP. The test pads 121 are arranged in such a position that tester's probes can directly touch them. Thus, the test pads 121 are preferably arranged with substantially the same pitch as a probe pitch of a normal tester. The number of pads is preferably substantially the same as the number of probes of a normal tester. This allows easy testing of the semiconductor chip using a normal tester and a probe card.

In this example, the test pads 121 are arranged in one line along each of two opposite sides of the circuit surface of the memory chip 2. The test pads 121 have a larger pitch than the memory I/O pads 122, and the number of pads is smaller than the number of the memory I/O pads 122. Further, the test pad 121 is larger than the memory I/O pads 122 to facilitate probing. The test pad 121 is large enough for probing. The test pad 121 has a rectangular shape elongated in the probing direction in case the probing position deviates from a predetermined position. Thus, the side of the test pad 121 is longer in the direction perpendicular to the array direction than in the array direction.

The memory I/O pads 122 are placed in the peripheral part of the circuit surface of the memory chip 2. The memory I/O pads 122 are not probed in the testing before forming SiP. The memory I/O pads 122 are used to electrically connect the memory chip 2 to the logic chip 1 in the SiP. The memory I/O pads 122 exchange signals with the logic chip 1 and receive a power supply voltage or a ground voltage from the logic chip 1.

In this example, the memory I/O pads 122 are arranged in a lattice (array) pattern at the position inner than the test pads 121. Since the memory I/O pads 122 are not probed in the test before forming SiP, a large number of pads are arranged with a small pitch regardless of the pitch or the number of tester's probes. The pitch between the memory I/O pads 122 is several tens of μm or smaller, for example. The number of the memory I/O pads 122 is preferably large in order to enable high-speed and high-volume data transmission between the memory chip 2 and the logic chip 1. The arrangement pattern of the memory I/O pads 122 is not limited to this example. The pads may be arranged in another pattern as long as a large number of pads can be placed.

The memory I/O pad 122 is large enough for connection with the logic COC I/O pad 112 by a bump. For example, the memory I/O pad 122 may have a rectangular shape of 20 μm and arranged at the pitch of 40 μm. The test pad 121 may have a rectangular shape of 20 μm in the array direction and 60 μm in the direction perpendicular to the array direction.

As shown in FIG. 1B, the logic chip 1 has test pads 111, logic COC I/O pads 112 (second I/O pads), and logic external I/O pads 113.

The logic external I/O pads 113 are placed in the peripheral part of the circuit surface of the logic chip 1. The logic external I/O pads 113 are used for electrical connection with an external device (external terminal) of the integrated circuit device. For example, the logic external I/O pads 113 exchange signals with the external device or receive a power supply voltage or a ground voltage from the external device in normal operations. The logic external I/O pads 113 are probed by a tester in the unit test of the logic chip before forming SiP or in the system test of the SiP.

The logic COC I/O pads 112 are placed on the circuit surface of the logic chip 1 in such a position that they face the memory I/O pads 122 when the memory chip 2 is mounted on top so as to make an electrical connection with the memory chip 2. The logic COC I/O pads 112 have the same shape and pitch as the memory I/O pads 122.

The test pads 111 are placed on the circuit surface of the logic chip 1 in such a position that they face the test pads 121 when the memory chip 2 is mounted on top so as to make an electrical connection with the memory chip 2. The test pads 111 have the same shape and pitch as the test pads 121. The test pads 111 are connected to the test pads 121 to supply a given voltage and so on to the memory chip 2. If the memory chip 2 can operate stably without connecting the test pads 111 to the test pads 121, this connection is unnecessary and the test pads 111 may be eliminated. Some of the test pads 111 or some of the test pads 121 may input or output the signal similar to the logic COC I/O pads 112 or the memory I/O pads 122 after completing the SiP.

The memory I/O pads 122 and the logic COC I/O pads 112 may be pads for inputting a signal from an external device, pads for outputting a signal to an external device, pads used both for inputting and outputting a signal, pads for receiving a power supply voltage from an external device, or pads for receiving a ground voltage from an external device. The test pads 121 and the test pads 111 are used for testing a wafer or a single semiconductor chip. Some of the test pads 121 and the test pads 111 may serve just like the memory I/O pads 122 and the logic COC I/O pads 112 after the integrated circuit device is completed.

Figure 2:
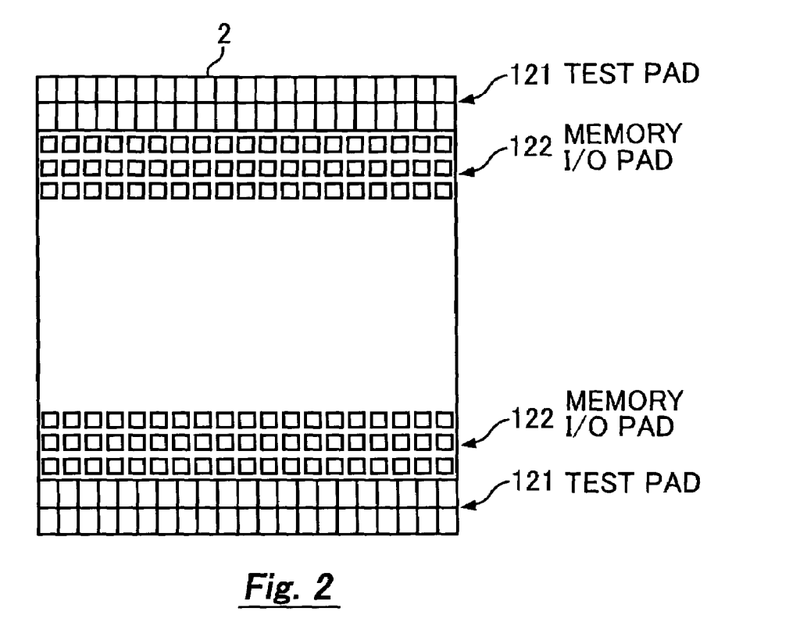
FIG. 2 is a schematic plan view of a semiconductor chip constituting an integrated circuit device according to the invention.
Figure 3:
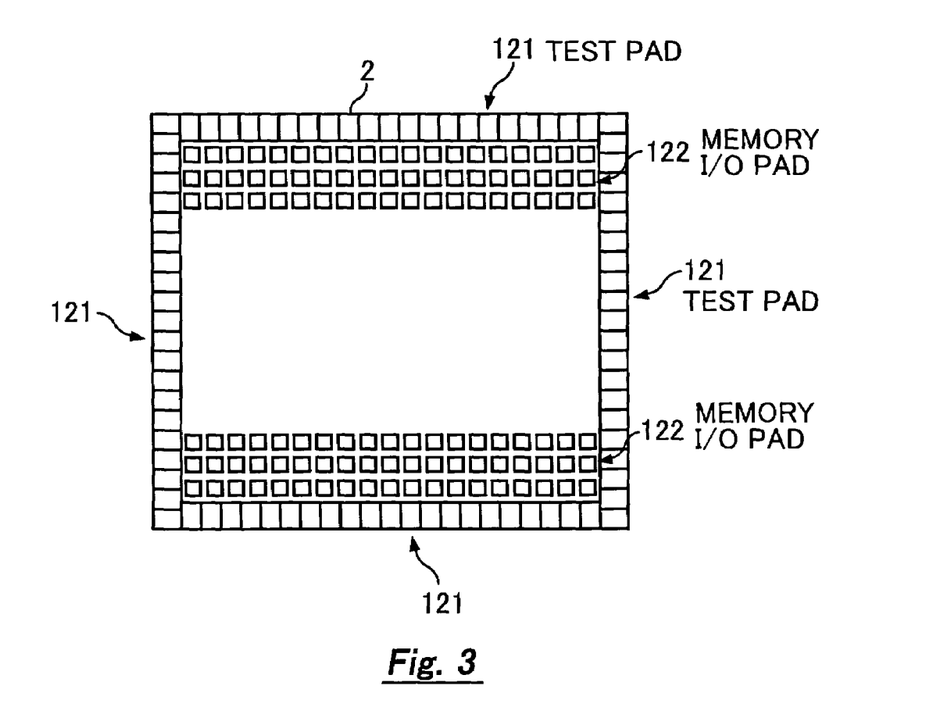
FIG. 3 is a schematic plan view of a semiconductor chip constituting an integrated circuit device according to the invention.
Figure 4:
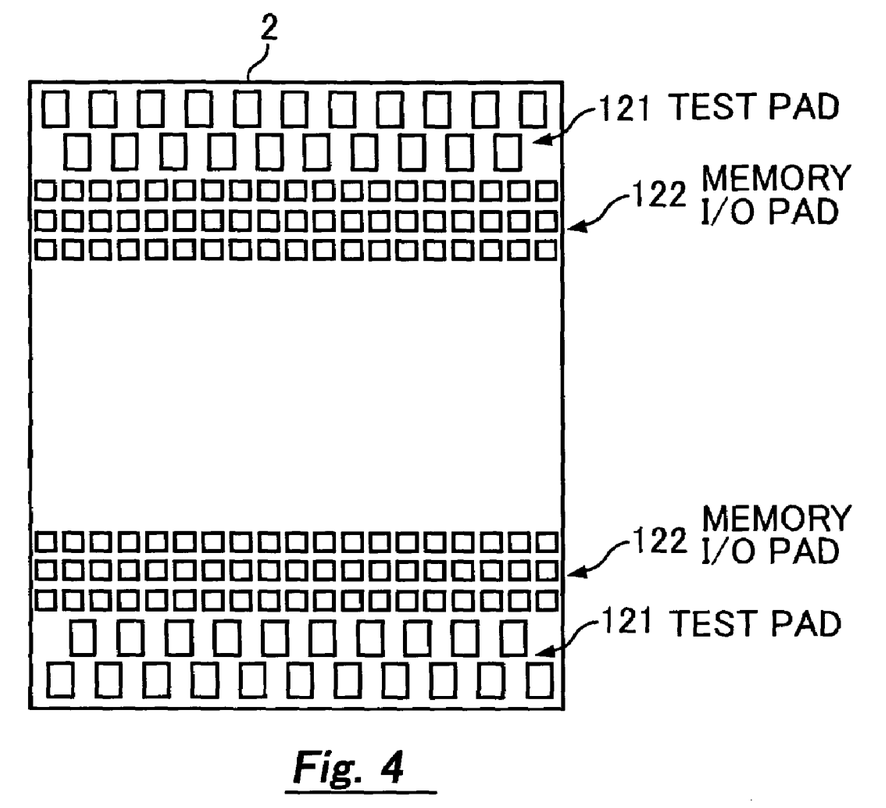
FIG. 4 is a schematic plan view of a semiconductor chip constituting an integrated circuit device according to the invention.

Since it is only required that the test pads 121 of the memory chip 2 be probed by a normal tester, they are not necessarily arranged in one line as shown in FIG. 1, and they may be arranged as shown in FIGS. 2 to 4. For example, as shown in FIG. 2, the test pads 121 may be arranged in two lines along each of the opposite two sides of the circuit surface of the memory chip 2. The test pads 121 may be arranged in an arbitrary number of lines of more than one. If the test pads 121 are arranged in a plurality of lines, the pitch between the lines may be the same as that of the memory I/O pads 122, which is, 40 µm, for example.

Alternatively, the test pads 121 may be arranged in one line along each of the four sides of the circuit surface of the memory chip 2 as shown in FIG. 3. Further, the test pads 121 may be arranged in a staggered pattern along each of the opposite two sides of the circuit surface of the memory chip 2 as shown in FIG. 4. In the example of FIG. 4, the test pads 121 includes a first pad line (outer pad line) and a second pad line (inner pad line) which are arranged in parallel in the peripheral part of the memory chip 2. The space between the test pads 121 of the first pad line is adjacent to each of the test pads 121 of the second pad line.

As shown in FIG. 1A, the memory chip 2 has the test pads 121 in addition to the memory I/O pads 122. Thus, when testing the memory chip 2 before forming SiP, the test pads 121 are probed but the memory I/O pads 122 are not probed and thus floating. Further, in the case where the logic chip 1 does not have the test pads 111, the test pads 121 are connected to nothing when forming SiP and thus floating. In this configuration, noise can be input from the memory I/O pads 122 when testing the memory chip 2 before forming SiP, and input from the test pads 121 after completing the SiP, which unstabilizes the operation of the memory chip 2.

Figure 5:
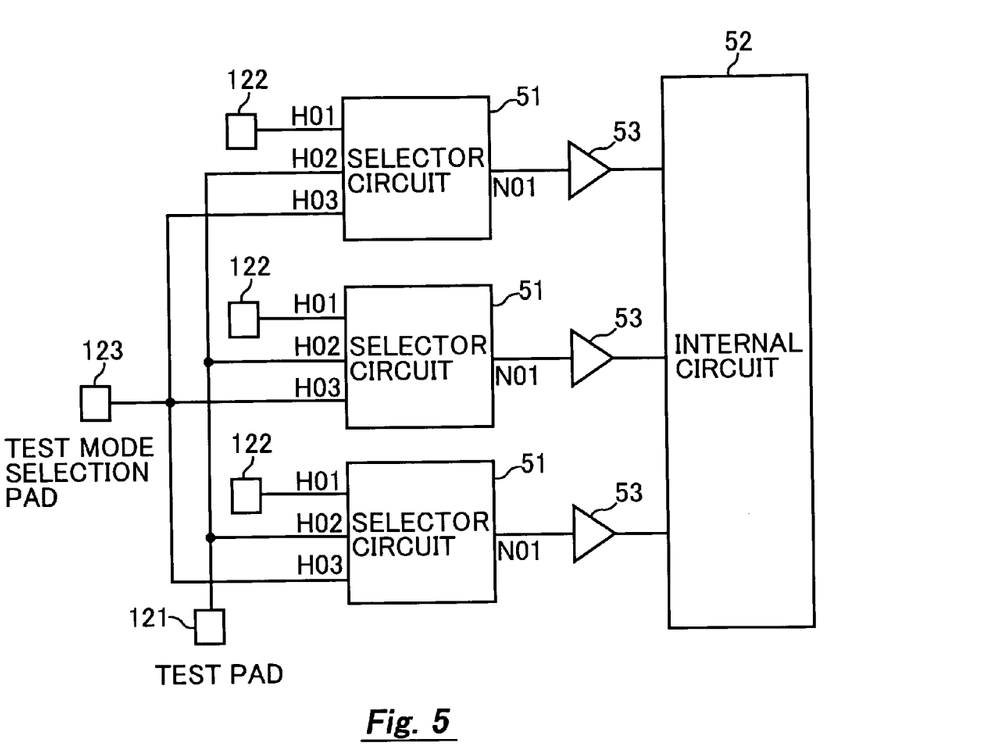
FIG. 5 is a circuit diagram illustrating the part surrounding selector circuits of a semiconductor chip according to the invention.

To overcome the above disadvantages, this embodiment places a selector circuit 51 in the I/O part between the pad and the internal circuit as shown in FIG. 5. The selector circuit 51 may applied to either the memory chip 2 or the logic chip 1. The case where the selector circuit 51 is used in the memory chip 2 is explained below.

The selector circuit 51 selects a signal from the test pad 121 or a signal from the memory I/O pad 122 and outputs the selected signal to an internal circuit 52. The selector circuit 51 has an input terminal H01 connected to the memory I/O pad 122, an input terminal H02 connected to the test pad 121, an input terminal H03 connected to a test mode selection pad 123, and an output terminal N01 connected to the internal circuit 52 via a buffer circuit 53.

The test mode selection pad 123 receives a selection signal to control the selection operation of the selector circuit 51. The test mode selection pad 123 is one of the test pads 121 of FIG. 1A, for example. The selector circuit 51 and the buffer circuit 53 are placed in the vicinity of the test pads 121 and the memory I/O pads 122 of FIG. 1A, for instance. The internal circuit 52 may be the memory cell block 21, the data I/O circuit 22, the address control circuit 23, or the like.

As described earlier, the memory I/O pads 122 are not probed and thus floating in the unit test of the semiconductor chip before forming SiP. In the SiP, the memory I/O pads 122 are connected to the logic chip 1 to exchange signals therewith. The test pads 121 are probed in the unit test of the single semiconductor chip before forming SiP as described earlier.

The selector circuit 51 selects between a signal from the test pad 121 and a signal from the memory I/O pad 122 according to a selection signal from the test mode selection pad 123, and outputs the selected signal to the buffer circuit 53. For example, the selector circuit 51 selects the signal from the test pad 121 if, in the unit test before forming SiP, a signal for selecting test mode is input to the test mode selection pad 123 from a tester through a probe. On the other hand, the selector circuit 51 selects the signal from the memory I/O pad 122 if, after completing the SiP, a selection signal is not input to the test mode selection pad 123. The buffer circuit 53, for example, amplifies the signal selected by the selector circuit 51 and outputs the amplified signal to the internal circuit 52. The selector circuit 51 prevents pad floating in the unit test of the semiconductor chip before forming SiP or pad floating after completing the SiP.

In the testing, the signal from the test pad 121 may be directly input to the selector circuit 51, or a test pattern generated in a test circuit such as a BIST circuit or a fixed logic signal may be input to the selector circuit 51. Though the example of FIG. 5 shows the case of using three selector circuits 51, the number of the selector circuits 51 is not limited to three but may be arbitrary. Further, though this example shows the case where the signal from the test pad 121 is commonly supplied to the selector circuits 51, the test pads may be placed for each of the selector circuits 51 so that a different signal is supplied to each of the elector circuits 51.

Figure 6:
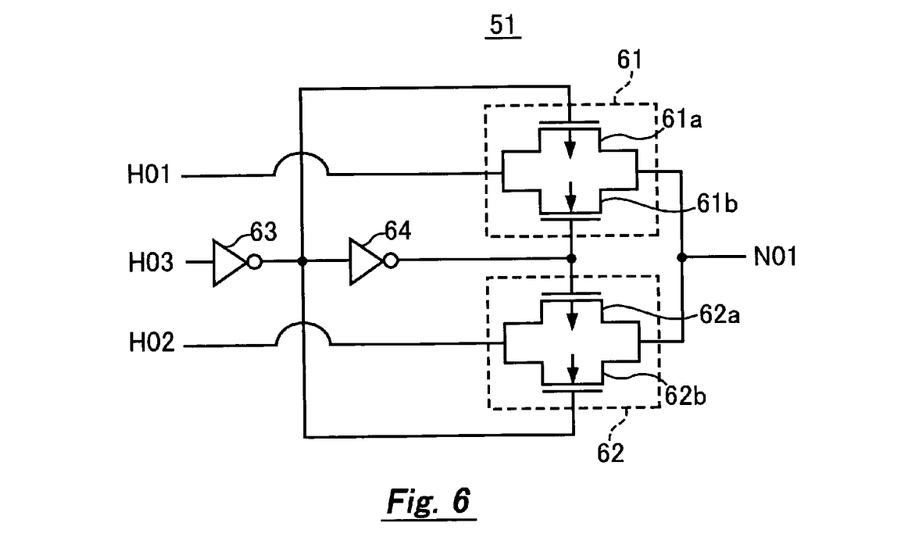
FIG. 6 is a circuit diagram illustrating the structure of a selector circuit of a semiconductor chip according to the invention.
Figure 7:
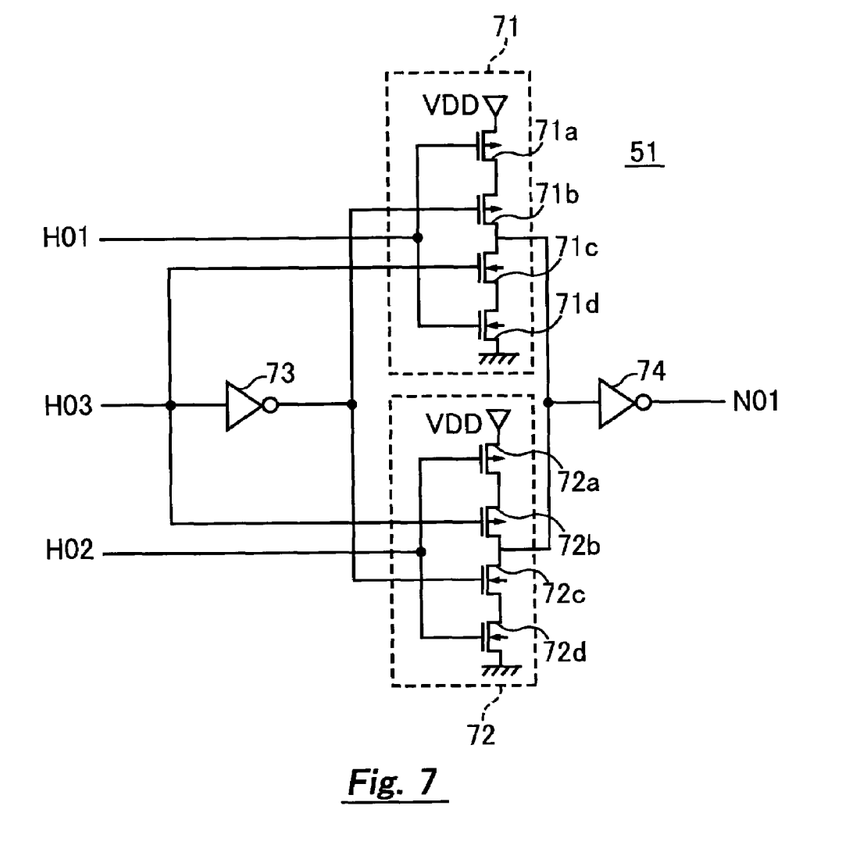
FIG. 7 is a circuit diagram illustrating the structure of a selector circuit of a semiconductor chip according to the invention.

The selector circuit 51 may have a transfer gate as shown in FIG. 6, or an AND circuit as shown in FIG. 7, for example.

The selector circuit 51 of FIG. 6. has two transfer gates 61 and 62. Either one of the transfer gates is turned on by a selection signal from the input terminal H03, thereby outputting from the output terminal N01 either one of the two input signals from the input terminals H01 and H02.

The transfer gate 61 has transistors 61a and 61b, and the transfer gate 62 has transistors 62a and 62b. The transistors 61a, 61b, 62a, and 62b are turned on or off according to an inverted signal from an inverter 63 which inverts the selection signal from the input terminal H03, or a non-inverted signal from an inverter 64 which inverts the inverted signal. If the input terminal H03 is at low level, the transistors 61a and 61b are turned on to connect the input terminal H01 and the output terminal N01. If, on the other hand, the input terminal H03 is at high level, the transistors 62a and 62b are turned on to connect the input terminal H02 and the output terminal N01.

The selector circuit 51 of FIG. 7 inputs input signals from the input terminals H01 and H02 and a selection signal from the input terminal H03 into AND circuits 71 and 72. The selector circuit 51 thereby outputs from the output terminal N01 either one of the two input signals from the input terminals H01 and H02 according to the selection signal.

The AND circuit 71 has transistors 71a to 71d, and the AND circuit 72 has transistors 72a to 72d. The transistors 71b, 71c, 72b, and 72c are turned on or off according to a selection signal from the input terminal H03 and an inverted signal from an inverter 73 which inverts the selection signal.

For example, if the input terminal H03 is at low level, the transistors 71b and 71c are turned on. The signal corresponding to the signal from the input terminal H01 being inverted by the inverter 74 is thereby output from the output terminal N01. If, on the other hand, the input terminal H03 is at high level, the transistors 72b and 72c are turned on. The signal corresponding to the signal from the input terminal H02 being inverted by the inverter 74 is thereby output from the output terminal N01.

Figure 8:
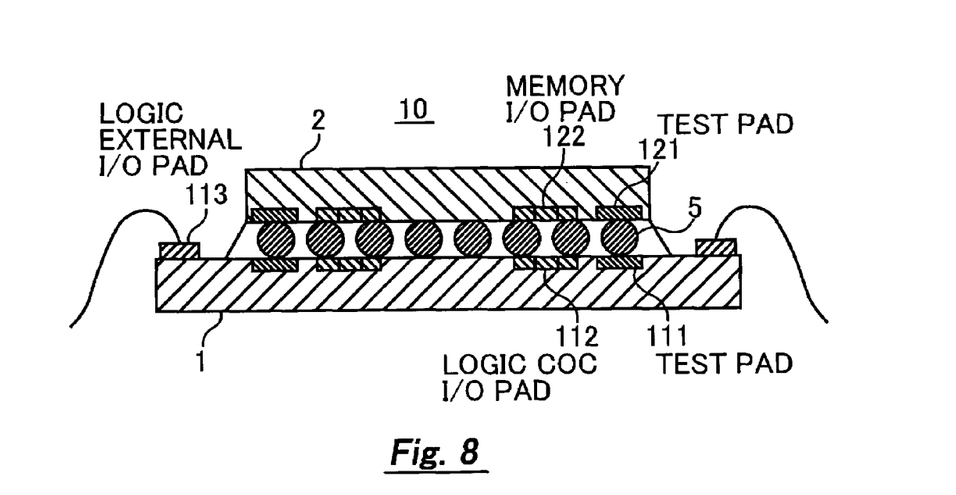
FIG. 8 is a schematic longitudinal cross-sectional view of an integrated circuit device according to the invention.

FIG. 8 is a schematic sectional view of the integrated circuit device of this embodiment. The circuit has the Chip-on-Chip SiP structure composed of the logic chip 1 of FIG. 1B and the memory chip 2 of FIG. 1A. In the integrated circuit device 10, the memory chip 2 is mounted on top of the logic chip 1. The logic COC I/O pads 112 and the memory I/O pads 122 are electrically connected by a gold bump 5. The test pads 121 and the test pads 111 are also electrically connected by the gold bump 5. The bump for connecting the logic chip 1 and the memory chip 2 is not limited to gold; copper, tin, and so on may be used instead.

The integrated circuit device 10 has a large number of the logic COC I/O pads 112 and the memory I/O pads 122 in a lattice pattern and connects those pads by the gold bump 5. This allows high-speed clock operation with the data transfer width of several hundreds of bits or greater and several hundreds of MHz or greater, and also allows data writing or reading with a low latency.

In the above example, the test pads 121 used for the unit test of the memory chip 2 before forming SiP are connected to the test pads 111 of the logic chip 1. However, the voltage of the test pads 111 may be set to a fixed logic (ground voltage or power supply voltage) by the wiring pattern in the logic chip 1. This prevents the pad floating in the SiP without placing the selector circuit like FIG. 5.

As described in the foregoing, this embodiment has test pads to be probed in a unit test of a semiconductor chip before forming SiP in addition to pads for inputting or outputting signals after completing SiP. It is thereby possible to test a single chip in a semiconductor wafer easily using a normal tester and a probe card. This increases the test coverage of the semiconductor chip, decreases testing time and cost, and improves yield of the semiconductor chip and the integrated circuit device.

Further, this embodiment has a selector circuit for selecting between a signal from a test pad and a signal from an I/O pad, which is placed in an I/O part of the semiconductor chip. This prevents pad floating in testing before forming SiP and pad floating in the SiP, thereby stabilizing the logic of the pad and the current consumption in the chip. This allows accurate testing of a wafer or a single chip before forming SiP, thereby stabilizing the operation of the SiP. Several hundreds of memory I/O pads in the memory chip are grouped into units of several tens by the test pads to be probed, and it is possible to conduct the test equivalent to the case of inputting test signals from all the memory I/O pads, which further improves yield.

Furthermore, this embodiment connects the test pads to the pads of another semiconductor chip when forming SiP. This eliminates the need for a circuit and so on to control the logic of the test pads, thereby decreasing the number of lines and the scale of circuit which are used exclusively for the testing, thus allowing more flexible design.

Second Embodiment

An integrated circuit device according to a second embodiment of the invention is explained hereinafter with reference to FIGS. 9 to 13. In this integrated circuit device, a memory chip (semiconductor chip) mounted on top has a BIST circuit which tests the memory chip itself.

Figure 9A:
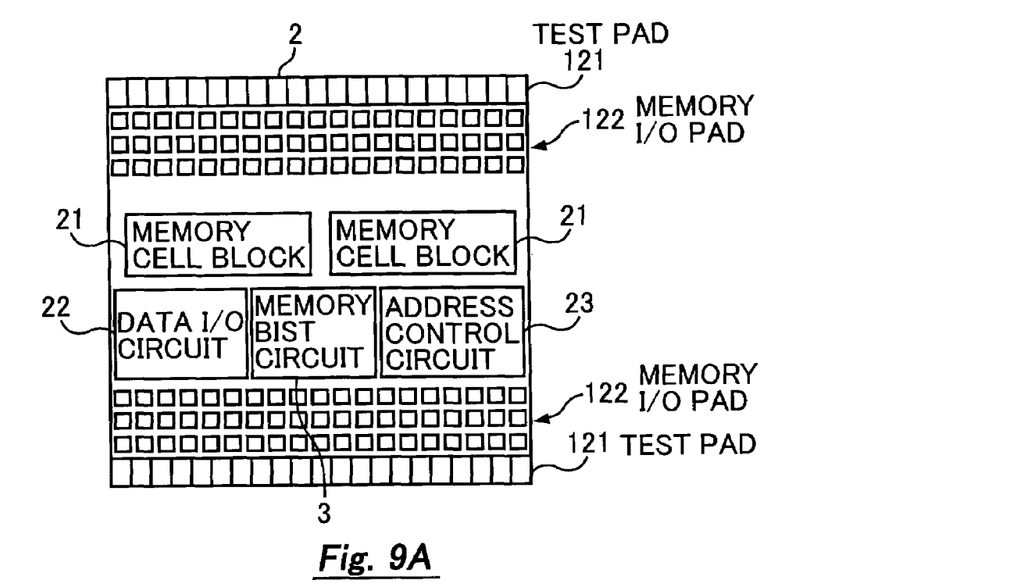
FIGS. 9A and 9B are schematic plan views of semiconductor chips constituting an integrated circuit device according to the invention.
Figure 9B:
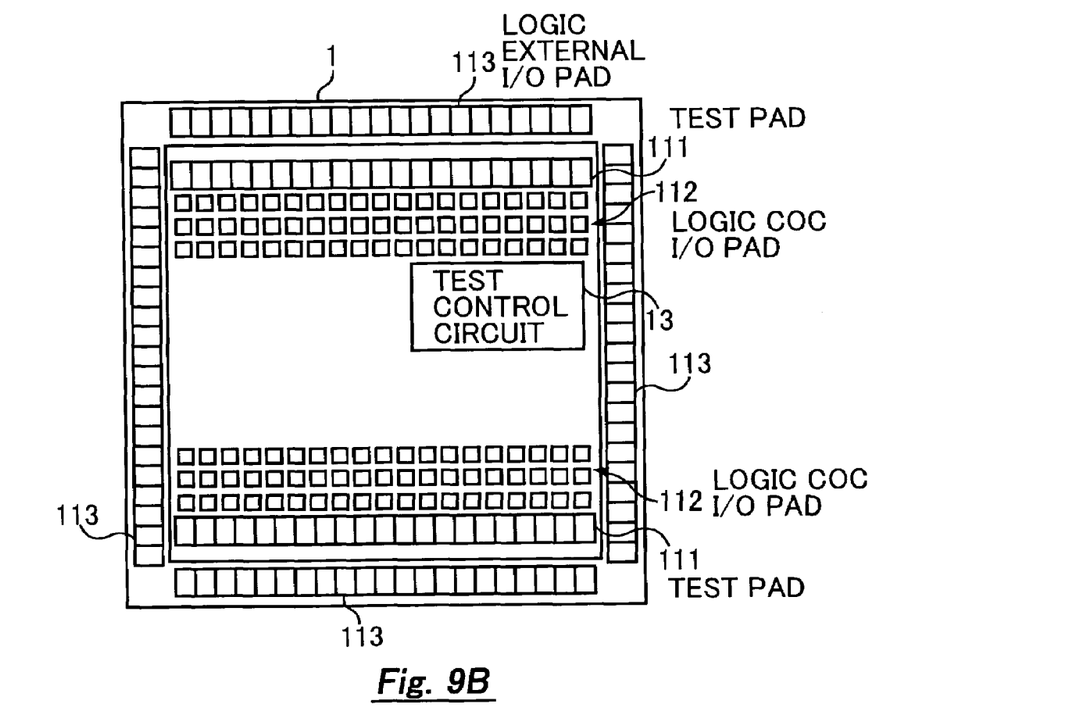

FIGS. 9A and 9B are schematic plan views of the memory chip 2 and the logic chip 1, respectively, which constitute a semiconductor integrated circuit 10. The memory chip 2 has a memory BIST circuit 3 in addition to the elements shown in FIG. 1A. The logic chip 1 has a test control circuit 13 in addition to the elements shown in FIG. 1B. In FIGS. 9A and 9B, the same reference symbols as in FIGS. 1A and 1B designate the same elements.

The memory BIST circuit 3 is an internal circuit placed in the memory chip 2 to test the memory chip 2. The memory BIST circuit 3, particularly, tests the data writing operation or reading operation of the memory chip 2. For example, the memory BIST circuit 3 generates a test pattern, tests the data writing operation or reading operation of the memory cell block 21 based on input clock and address, and outputs the test results.

The test control circuit 13 is an internal circuit of the logic chip 1. It serves both as a control circuit for controlling the testing on the memory chip 2 and a transfer circuit for transferring signals from a tester or the memory BIST circuit 3. When testing the memory chip 2 after completing SiP, the test control circuit 13 transfers the clock and address input by the tester to the memory BIST circuit 3, and transfers the test result of the memory BIST circuit 3 to the tester.

Figure 10:
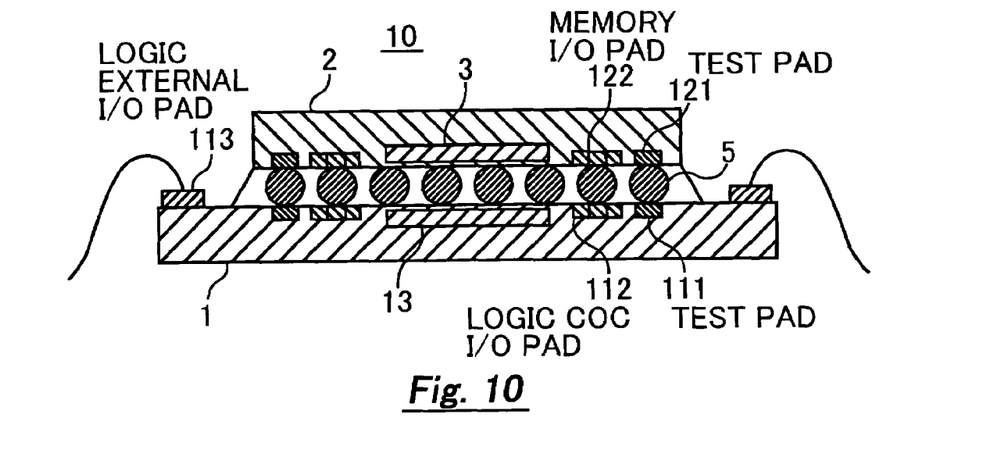
FIG. 10 is a schematic longitudinal cross-sectional view of an integrated circuit device according to the invention.

FIG. 10 is a schematic sectional view of an integrated circuit device 10 of this embodiment, which has the Chip-on-Chip SiP structure composed of the logic chip 1 of FIG. 9B and the memory chip 2 of FIG. 9A. The memory chip 2 is mounted on top of the logic chip 1 via the gold bump 5, just like the device of FIG. 8. In this embodiment, the test control circuit 13 of the logic chip 1 and the memory BIST circuit 3 of the memory chip 2 are connected via the logic COC I/O pad 112, the gold bump 5, and the memory I/O pad 122.

Figure 11:
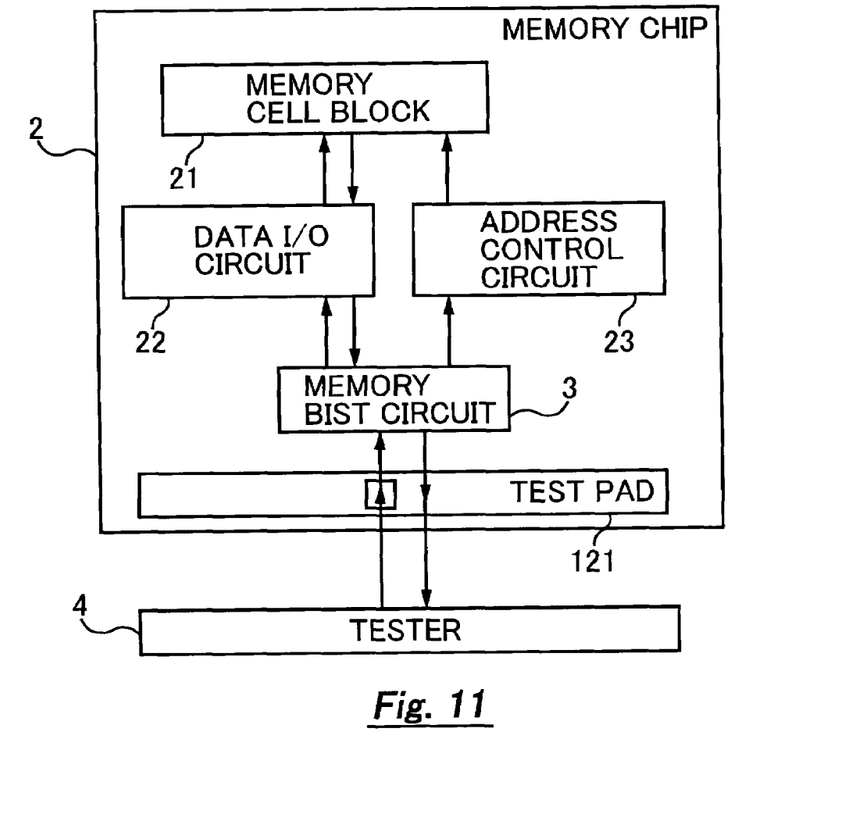
FIG. 11 is a block diagram of a semiconductor chip according to the invention.

The operation when the memory BIST circuit 3 tests the memory chip 2 is explained below. FIG. 11 is a block diagram in the unit test of the memory chip 2 before forming the SiP. When testing the memory chip 2 alone, a tester 4 first probes the test pads 121 to make an electrical connection.

The tester 4 inputs a clock for testing and a data writing address and reading address to the memory BIST circuit 3 via the test pad 121.

The memory BIST circuit 3 generates a test pattern and writes or reads the test pattern to or from the memory cell block 21 according to the clock and address from the tester 4. Then, the memory BIST circuit 3 compares the read value with an expected value to determine if a defect exists. The test pattern is written to or read from the memory cell block 21 via the address control circuit 23 and the data I/O circuit 22. The memory BIST circuit 3 outputs the test result to the tester 4 via the test pad 121.

Figure 12:
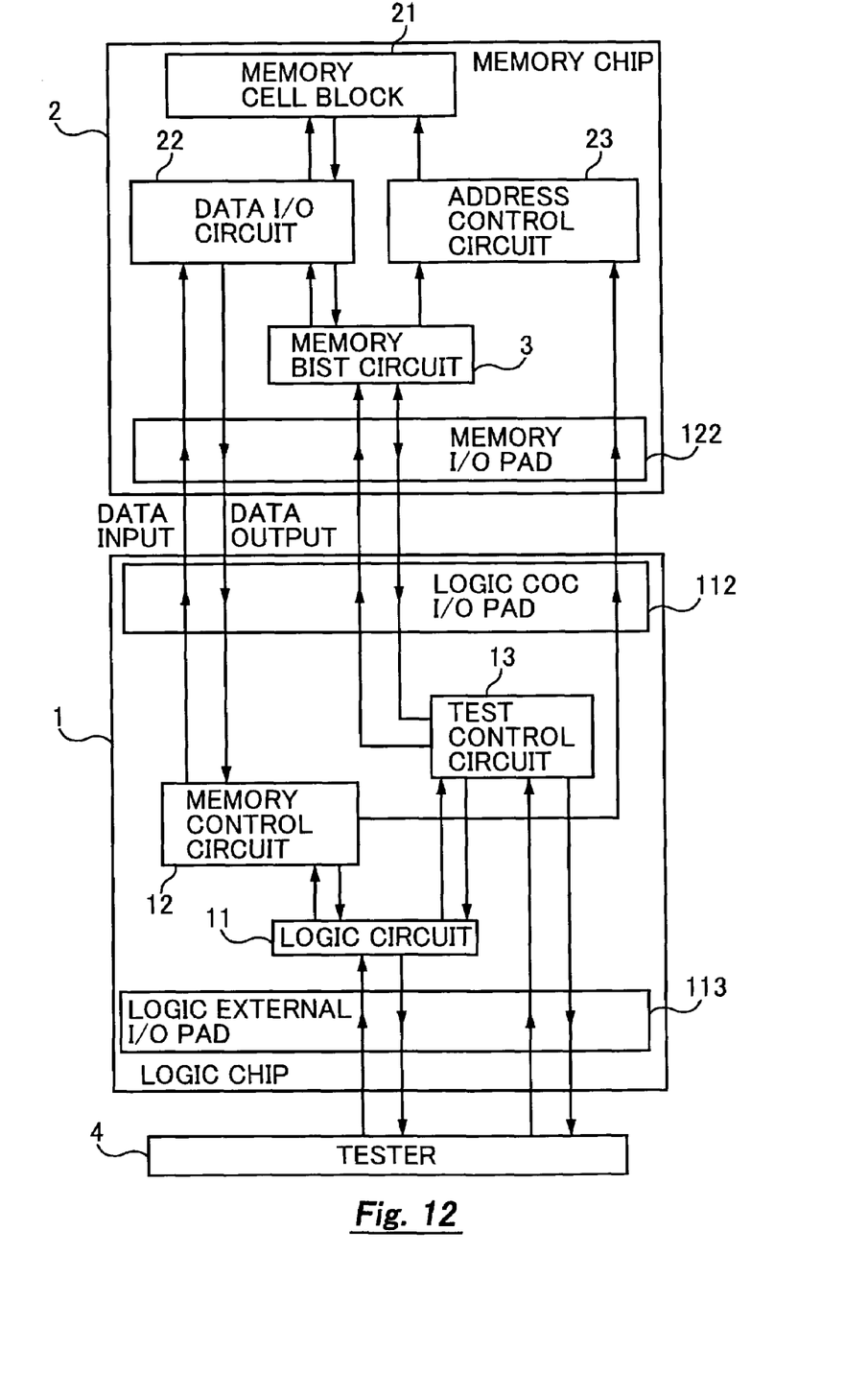
FIG. 12 is a block diagram of a semiconductor chip according to the invention.

FIG. 12 is a block diagram in the case of testing the memory chip 2 via the logic chip 1 after completing the SiP. When testing the memory chip 2 in the SiP, the tester 4 probes the logic external I/O pad 113 to make an electrical connection.

The tester 4 inputs a clock for testing and a data writing address and reading address to the test control circuit 13 via the logic external I/O pad 113. The test control circuit 13 transfers the clock and address from the tester 4 to the memory BIST circuit 3 via the logic COC I/O pad 112 and the memory I/O pad 122.

The memory BIST circuit 3 operates in the same manner as in the unit test shown in FIG. 11. Thus, the memory BIST circuit 3 generates a test pattern and tests the memory cell block 21 according to the clock and address from the test control circuit 13. The memory BIST circuit 3 outputs the test results to the test control circuit 13 via the memory I/O pad 122 and the logic COC I/O pad 112. The test control circuit 13 transfers the test result from the memory BIST circuit 3 to the tester 4 via the logic external I/O pad 113.

In this embodiment, the signals exchanged between the memory BIST circuit 3 and the test control circuit 13 are only clocks and addresses. Thus, the parasitic capacitance causes no substantial effect in the logic COC I/O pad 112 and the memory I/O pad 122, thereby allowing high-speed and accurate testing just like the unit test of the memory chip 2.

The logic chip 1 includes a logic circuit 11 and a memory control circuit 12. The logic circuit 11 performs logical operations. The memory control circuit 12 controls data writing or reading to or from the memory chip 2. The logic circuit 11 and the memory control circuit 12 operate in normal operations of the integrated circuit device 10 or in testing of the integrated circuit device 10 as a whole.

For example, when testing the whole system of the integrated circuit device 10, the tester 4 inputs a clock and test pattern to the logic circuit 11 via the logic external I/O pad 113. The logic circuit 11 performs a certain logical operation on the input test pattern. The data necessary for the logical operation and the operation results are read from or written to the memory chip 2 by the memory control circuit 12. The memory control circuit 12 inputs or outputs the address or data instructed by the logic circuit 11 to or from the address control circuit 23 or the data I/O circuit 22 via the logic COC I/O pad 112 and the memory I/O pad 122, thereby writing or reading data to or from the memory cell block 21. Then, the logic circuit 11 outputs the operation result to the tester 4 via the logic external I/O pad 113.

Figure 13:
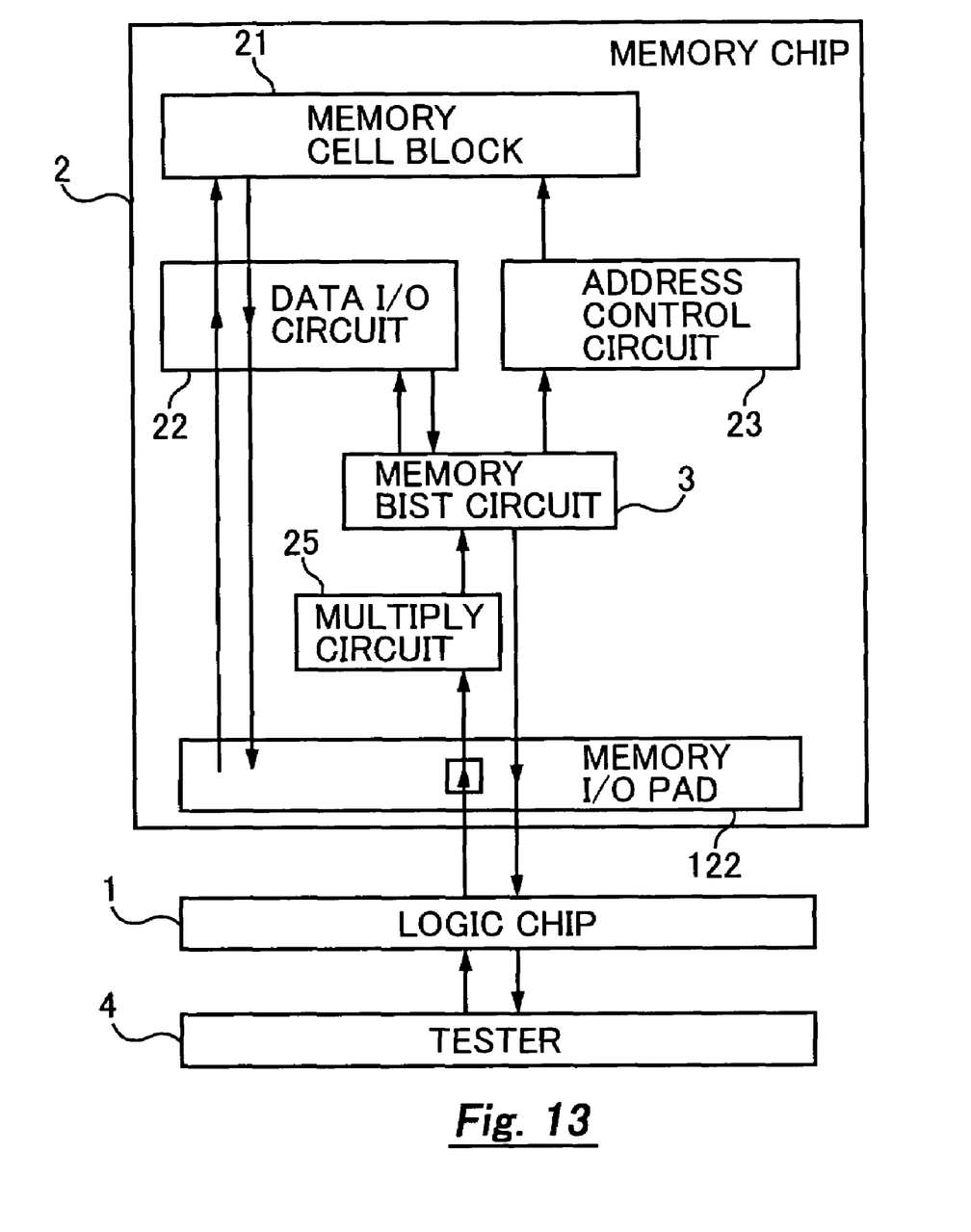
FIG. 13 is a block diagram of a semiconductor chip according to the invention.

As shown in FIG. 13, the memory chip 2 may further have a multiply circuit 25. The multiply circuit 25 multiplies the frequency of the clock input via the memory I/O pad 122 when testing the memory chip 2 after completing SiP as shown in FIG. 12. Use of the multiply circuit 25 allows lowering the frequency of the clock for testing supplied to the memory chip 2, thereby enabling the high-speed testing using a low-cost tester 4. It also allows lowering the frequency of the clocks exchanged between the logic chip 1 and the memory chip 2, which further reduces the effect of the parasitic capacitance.

The multiply circuit 25 may operate also in the unit test of the memory chip 2 as shown in FIG. 11. This also enables the high-speed testing with a low-cost tester 4.

As described above, this embodiment places a BIST circuit for memory testing in the memory chip 2, in addition to the configuration of the first embodiment. This embodiment thereby not only allows the unit test of the memory chip 2 before forming SiP just like the first embodiment, but also further improves the efficiency of the testing. For example, by testing the memory chip 2 alone with the memory BIST circuit 3 before forming SiP to sort defective chip and non-defective chip by the operation speed, it is possible to form the SiP using the memory chip 2 appropriate for the specification of the logic chip 1 requiring a different operation speed.

Further, use of the memory BIST circuit 3 reduces the effect of the parasitic capacitance between the logic chip 1 and the memory chip 2 in the testing of the memory chip 2 after completing the SiP, thereby allowing the testing of the memory chip 2 with a high-speed clock just like the testing before forming the SiP. This increases the test coverage and improves the yield of the integrated circuit device. Though this embodiment explains the case where the memory chip 2 has the test pads 121, the same advantage can be obtained after completing the SiP if the test pads 121 are eliminated.

Other Embodiments

Figure 14:
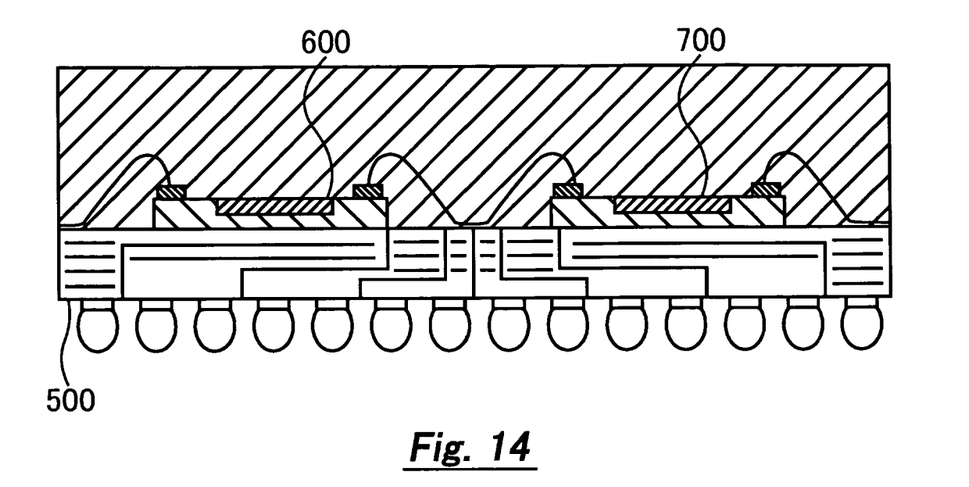
FIG. 14 is a schematic longitudinal cross-sectional view of an integrated circuit device according to the invention.

Though the present invention is applied to the Chip-on-Chip SiP in the above example, it is not limited thereto, and the invention may be applied to other SiP. For example, the present invention may be applied to SiP in which a logic chip 600 and a memory chip 700 are mounted in one substrate 500 as shown in FIG. 14. The same advantage as the case of using COC structure can be obtained in this configuration.

It is apparent that the present invention is not limited to the above embodiment that may be modified and changed without departing from the scope and spirit of the invention.

What is claimed is:

1. An integrated circuit device comprising:
a first semiconductor chip comprising a plurality of first input/output pads which are arranged in matrix form having at least three rows and three columns, and a plurality of first test pads which are placed outside of the plurality of first input/output pads and which are larger than the first input/output pads; and
a second semiconductor chip comprising a plurality of second input/output pads connected to the plurality of first input/output pads, and a plurality of second test pads connected to the plurality of first test pads, wherein
at least one of the plurality of first test pads is electrically connected with at least one of the plurality of first input/output pads inside the first semiconductor chip, and
wherein the second semiconductor chip further comprises a plurality of third input/output pads connected to an external terminal of the integrated circuit, and the first semiconductor chip is connected to the external terminal via the second semiconductor chip.

2. The integrated circuit device of claim 1, wherein
the plurality of first input/output pads and the plurality of second input/output pads are connected by a conductive bump,
the plurality of first input/output pads are large enough to be connected to the plurality of second input/output pads by the conductive bump, and
the plurality of first test pads are large enough to be touched by a probe to test a function of the first semiconductor chip in a wafer state or in a chip alone.

3. The integrated circuit device of claim 1, wherein the plurality of first test pads are arranged in one line, in two lines, or in a staggered pattern along the plurality of first input/output pads.

4. The integrated circuit device of claim 1, wherein the plurality of first test pads are arranged in such a way that a first pad line and a second pad line are placed in parallel, and a space between the first test pads in the first pad line is adjacent to each of the first test pads in the second pad line.

5. The integrated circuit device of claim 1, wherein each of the plurality of first test pads has such a shape that a side perpendicular to the first and second pad lines is longer than a side along the first and second pad lines.

6. The integrated circuit device of claim 1, wherein the first semiconductor chip further comprises a signal selection circuit selecting a signal from one of the plurality of first test pads and outputs the selected signal to an internal circuit in testing of a wafer or a chip alone, and selecting a signal from one of the plurality of first input/output pads and outputs the selected signal to the internal circuit in normal times different from the testing.

7. The integrated circuit device of claim 6, wherein one of the plurality of first test pads is connected to a pad placed in the second semiconductor chip and connected to a fixed voltage, and a selection signal is supplied to the signal selection circuit via the test pad based on the fixed voltage.

8. The integrated circuit device of claim 1, wherein the plurality of first input/output pads and the plurality of second input/output pads are pads for inputting a signal from outside, pads for outputting a signal to outside, pads used both for inputting and outputting a signal from or to outside, pads for receiving a power supply voltage from outside, or pads for receiving a ground voltage from outside, and the plurality of first and second test pads are pads used for testing of a wafer or a semiconductor chip alone.

9. The integrated circuit device of claim 1, wherein the first semiconductor chip further comprises:

a built-in self-test circuit which is a control circuit for a unit test of the first semiconductor chip, and a multiply circuit multiplying a frequency of a clock supplied from outside and supplying the clock to the built-in self-test circuit.

10. An integrated circuit device comprising:

a memory chip comprising a plurality of first input/output pads which are arranged in matrix form having at least three rows and three columns and a plurality of first probe test pads larger than the plurality of first input/output pads; and a non-memory chip placed below the memory chip and comprising a plurality of second input/output pads connected to the plurality of first input/output pads by a bumps, and a plurality of second probe test pads larger than the plurality of second input/output pads connected to the plurality of first probe test pads by bumps, wherein at least one of the plurality of first test pads is electrically connected with at least one of the plurality of first input/output pads inside the memory chip, and wherein the non-memory chip further comprises a plurality of third input/output pads connected to an external terminal of the integrated circuit, and the memory chip is connected to the external terminal via the non-memory chip.

11. The integrated circuit device of claim 10, wherein the plurality of first probe test pads are arranged in line in a peripheral part of the memory chip.

12. The integrated circuit device of claim 10, wherein the plurality of first probe test pads are arranged in the same way as probes probed in testing.

13. The integrated circuit device of claim 10, wherein the number of the plurality of first probe test pads is smaller than the number of the plurality of first input/output pads.

14. The integrated circuit device of claim 10, wherein the plurality of first probe test pads receive a fixed voltage from the non-memory chip via the bump.

15. The integrated circuit device of claim 10, wherein the memory chip further comprises a test circuit for testing the memory chip, connected to a tester via the plurality of first probe test pads or the plurality of first input/output pads and the plurality of second input/output pads.

* * * * *